United States Patent
Wu et al.

(10) Patent No.: US 7,038,492 B2
(45) Date of Patent: May 2, 2006

(54) PROGRAMMABLE LEVEL SHIFTER FOR WIDE RANGE OPERATION PURPOSE

(75) Inventors: Chih-Hung Wu, Kaohsiung (TW); Meng-Jer Wey, Hsinchu (TW)

(73) Assignee: Faraday Technology Corp., Hsin-chu (TW)

( * ) Notice: Subject to any disclaimer, the term of this patent is extended or adjusted under 35 U.S.C. 154(b) by 75 days.

(21) Appl. No.: 10/912,806

(22) Filed: Aug. 6, 2004

(65) Prior Publication Data

US 2006/0028243 A1  Feb. 9, 2006

(51) Int. Cl.
*H03K 19/094* (2006.01)
(52) U.S. Cl. .......................................... 326/81; 326/68
(58) Field of Classification Search ................. 326/68, 326/80, 81
See application file for complete search history.

(56) References Cited

U.S. PATENT DOCUMENTS 5,852,371 A * 12/1998 Merritt et al. ................. 326/81
6,094,083 A *  7/2000 Noda .......................... 327/333
6,373,315 B1 *  4/2002 Tsuji et al. ................... 327/333

* cited by examiner

*Primary Examiner*—James H. Cho
(74) *Attorney, Agent, or Firm*—Winston Hsu

(57) ABSTRACT

A programmable level shifter. The programmable level shifter comprises a first P-type FET, a first N-type FET, a second P-type FET, a second N-type FET, an inverter, and a programmable device. The first P-type FET is coupled between a fist power line and an output node. The first N-type FET is coupled between the first P-type FET and a second power line. The programmable device is coupled between the first power line and the output node, which can be programmed to change an effective resistance between the first power line and the output node when the second P-type FET is turned on.

4 Claims, 3 Drawing Sheets

PROGRAMMABLE LEVEL SHIFTER FOR WIDE RANGE OPERATION PURPOSE

BACKGROUND

The invention relates to a level shifter, and more particularly to a programmable level shifter.

In many logic, memory and timing arrangements, communication between functional blocks requires different driving voltages. Voltage level shifters provide an interface for output of voltage levels from one block that does not meet the voltage level requirements of an interconnected block.

FIG. 1 shows a circuit diagram of a conventional level shifter. Typically, a level shifter 1 transforms a low input voltage level Vin to a high voltage level swinging between a ground Vg and a high power supply voltage Vcc1. When the input voltage level Vin is at a low logic of approximately zero volts, for example, an N-type FET MN2 is turned off and a N-type FET MN1 is turned on. While the N-type FET MN1 is completely turned on, an output node Vo is pulled down substantially to the ground Vg. In contrast to the previous example, when the input voltage level Vin is at a high logic, the output node Vo is pulled up substantially to the high power supply voltage Vcc1 while the N-type FET MN2 is completely turned on.

With respect to achieving a desired electrical performance or functional ability, commonly, the level shifter 1 has a predetermined ratio of a pull-up device and a pull-down device. The level shifter 1, however, may malfunction when either the input voltage level Vin or the high power supply voltage Vcc1 thereto is altered. For example, when the level shifter 1 is designed to transform a 1.8-volt voltage level to a 2.5-volt voltage level, if the level shifter 1 is disposed in a 3.3-volt IO circuit to provide a specific circuit with 3.3-volt voltage level, the output Vo thereof may not be pulled up or be pulled down substantially, thus a malfunction occurs and performance such as balanced delay time thereof would be affected. Hence, the conventional level shifter 1 is only capable of driving the specific circuit with a specific operational voltage level, affecting compatibility.

SUMMARY

An aspect of the invention provides a programmable level shifter, which comprises a first P-type field effect transistor (FET), a first N-type FET, a second P-type FET, a second N-type FET, an inverter, and a programmable device.

The first P-type FET is coupled between a first power line and an output node. The first N-type FET is coupled between the first P-type FET and a second power line, and has a gate electrode coupled to an inverted input node. The second P-type FET is coupled between the first power line and a gate electrode of the first P-type FET, and has a gate electrode coupled to the output node. The second N-type FET is coupled between the second P-type FET and the inverted input node, and has a gate electrode coupled to a third power line. The programmable device is coupled between the first power line and the output node, and comprises at least a third P-type FET. The inverter is coupled between a non-inverted input node and the inverted input node. The programmable device can be programmed to determine whether the third P-type FET is connected in parallel with the first P-type FET to change an effective resistance between the first power line and the output node when the first P-type FET is turned on.

Thus, the effective resistance between the first power line and the non-output node can be changed after the programmable device is programmed, i.e., a pull-up device of the programmable level shifter has two effective states, thus, improving compatibility.

BRIEF DESCRIPTION OF THE DRAWINGS

An embodiment of the invention will become more fully understood by referring to the following detailed description and accompanying drawings, wherein.

DETAILED DESCRIPTION

Figure 1:
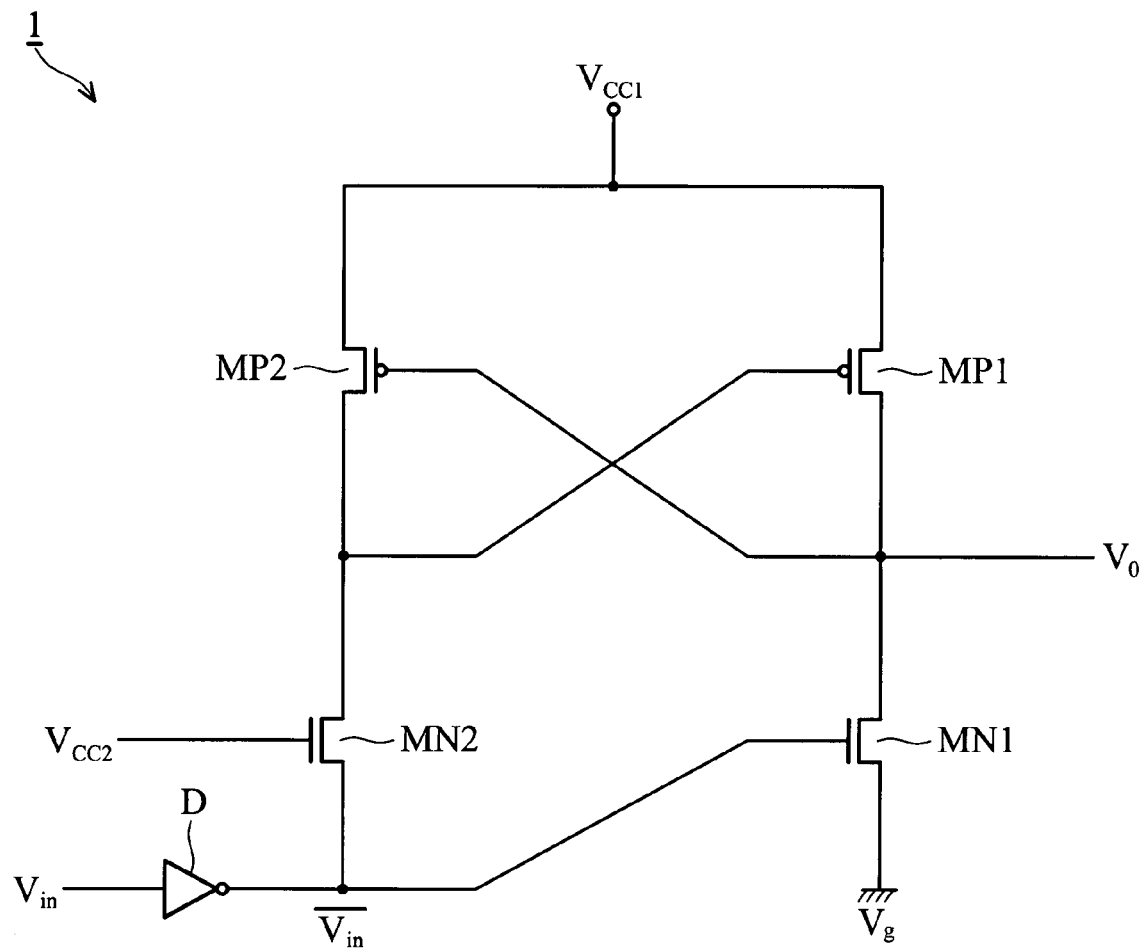
FIG. 1 shows a circuit diagram of a conventional level shifter.
Figure 2:
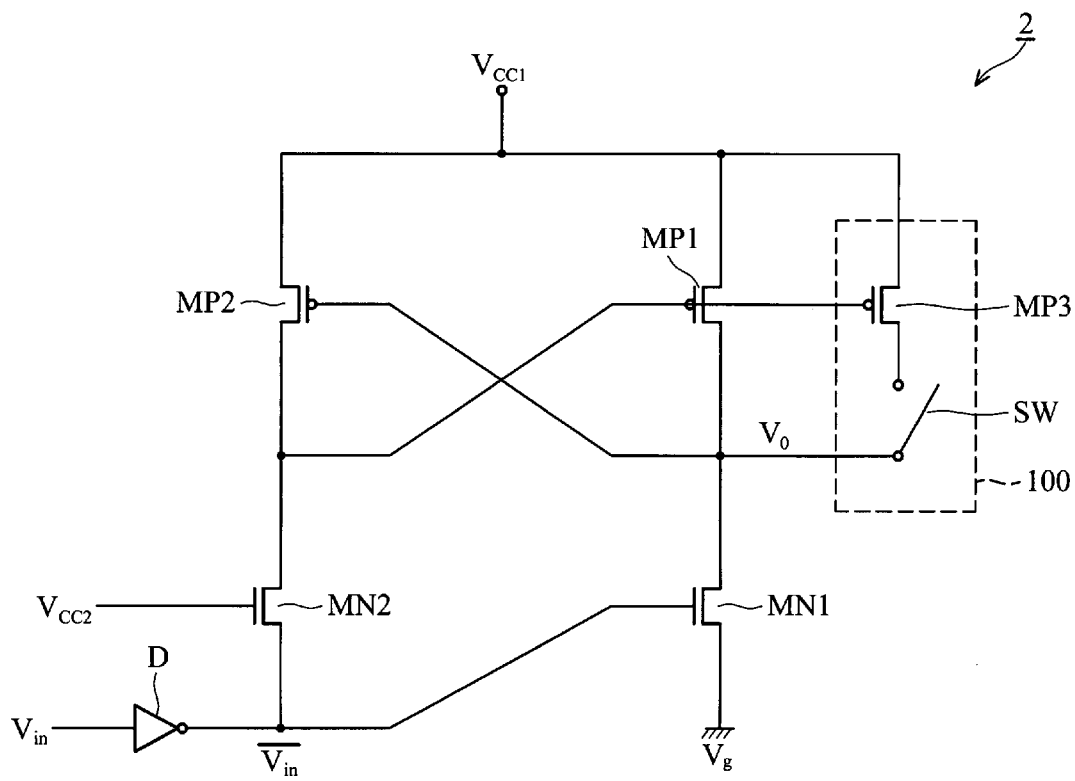
FIG. 2 shows a circuit diagram of a programmable level shifter according to the invention.

FIG. 2 shows a circuit of a level shifter of an embodiment of the invention. The programmable level shifter 2 comprises a P-type field effect transistor (FET) MP1, an N-type FET MN1, a P-type FET MP2, an N-type FET MN2, an inverter, and a programmable device 100. The P-type FET MP1 is coupled between a power line Vcc1 and an output node Vo. The N-type FET MN1 is coupled between the P-type FET MP1 and a ground Vg, and has a gate electrode coupled to an inverted input node $\overline{V_{in}}$. The P-type FET MP2 is coupled between the power line Vcc1 and a gate electrode of the P-type FET MP1, and has a gate electrode coupled to the output node Vo. The N-type FET MN2 is coupled between the P-type FET MP2 and the inverted input node $\overline{V_{in}}$, and has a gate electrode coupled to a power line Vcc2. The inverter D is coupled between a non-inverted input node Vin and the inverted input node $\overline{V_{in}}$. The programmable device 100 is coupled between the power line Vcc1 and the output node Vo, and comprises at least a P-type FET MP3. The programmable device 100 can be programmed to determine whether the P-type FET MP3 is connected in parallel with the P-type FET MP1 to change an effective resistance between the power line Vcc1 and the output node Vo when the P-type FET MP1 is turned on. The N-type FET, for example, is a NMOS, and the P-type FET, for example, is a PMOS.

Figure 3:
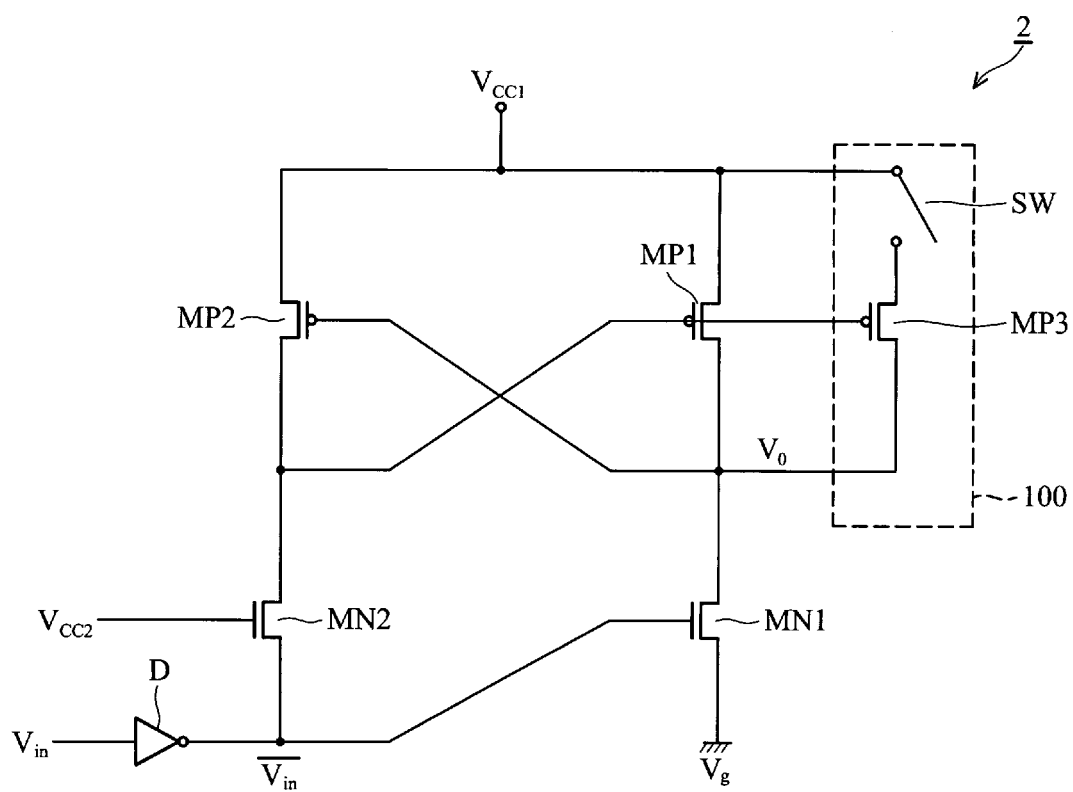
FIG. 3 shows a circuit diagram of a programmable level shifter according to the invention.

The programmable device 100 further comprises a switch SW such as a programmable fuse. The switch SW is connected in series with the P-type FET MP3. For example, the switch SW can be coupled between the P-type FET MP3 and the output node Vo as shown in FIG. 2, or coupled between the power line Vcc1 and the P-type FET MP3 as shown in FIG. 3.

The effective resistance between the power line Vs and the output node Vo is a pull-up resistance of the programmable level shifter 2. Thus, according to the previous description, the programmable device 100 has two alternative states, i.e., the pull-up resistance also has two alternative states. Hence, the programmable level shifter 2 can be designed to fit in two specific IO circuits with different supply voltage levels.

For example, a programmable level shifter according to the invention may transforms a 1.8-volt voltage level to a 2.5-volt voltage level when the programmable device 100 is programmed, and may also be capable of transforming a 1.8-volt voltage level to a 3.3-volt voltage level when the programmable device 100 is not programmed. Therefore the programmable level shifter can be applied in both a 3.3-volt IO circuit and a 2.5-volt IO circuit to drive specific circuits thereto, thus improving compatibility.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A programmable level shifter, comprising:
    a first P-type FET coupled between a first power line and an output node;
    a first N-type FET coupled between the first P-type FET and a second power line, having a gate electrode coupled to an inverted input node;
    a second P-type FET coupled between the first power line and a gate electrode of the first P-type FET, having a gate electrode coupled to the output node;
    a second N-type FET coupled between the second P-type FET and the inverted input node, having a gate electrode coupled to a third power line;
    an inverter coupled between a non-inverted input node and the inverted input node; and
    a programmable device coupled between the first power line and the output node, comprising at least a third P-type FET; wherein the programmable device can be programmed to determine whether the third P-type FET is connected in parallel with the first P-type FET to change an effective resistance between the first power line and the output node when the first P-type FET is turned on.

2. The programmable level shifter of claim 1, wherein, the programmable device has a switch connected in series with the third P-type FET and between the first power line and the output node.

3. The programmable level shifter of claim 2, wherein, the switch is between the third P-type FET and the first power line.

4. The programmable level shifter of claim 2, wherein, the switch is between the third P-type FET and the output node.

* * * * *